(12) United States Patent
Marconetti

(10) Patent No.: US 7,047,481 B2
(45) Date of Patent: May 16, 2006

(54) DECODING METHOD AND DECODER FOR REED SOLOMON CODE

(75) Inventor: Emanuel Marconetti, Dublin (IE)

(73) Assignee: Koninklijke Philips Electronics N.V., Eindhoven (NL)

( * ) Notice: Subject to any disclaimer, the term of this patent is extended or adjusted under 35 U.S.C. 154(b) by 487 days.

(21) Appl. No.: 10/264,902

(22) Filed: Oct. 4, 2002

(65) Prior Publication Data

US 2003/0097632 A1    May 22, 2003

(30) Foreign Application Priority Data

Oct. 26, 2001  (GB) .................................. 0125748.4
Feb. 27, 2002  (GB) .................................. 0204576.3

(51) Int. Cl.
*H03M 13/00*    (2006.01)

(52) U.S. Cl. ...................... 714/784; 714/756

(58) Field of Classification Search ........ 714/784–785, 714/782, 756; 708/492, 505
See application file for complete search history.

(56) References Cited

U.S. PATENT DOCUMENTS

| | | | | |
|---|---|---|---|---|
| 4,845,713 A | * | 7/1989 | Zook | 714/784 |
| 5,130,990 A | * | 7/1992 | Hsu et al. | 714/784 |
| 5,754,563 A | * | 5/1998 | White | 714/757 |
| 5,896,397 A | * | 4/1999 | Tolhuizen et al. | 714/719 |
| 6,092,233 A | * | 7/2000 | Yang | 714/784 |
| 6,279,137 B1 | * | 8/2001 | Poeppelman et al. | 714/781 |
| 6,449,746 B1 | * | 9/2002 | Truong et al. | 714/784 |
| 6,574,771 B1 | * | 6/2003 | Kwon | 714/782 |

OTHER PUBLICATIONS

"On decoding BCH codes" Forney, Jr., IEEE Trans. Inform. Theory, vol. IT-11, pp. 549-557, Oct. 1965.
"On decoding of both errors and erasures of a Reed-Solomon code using an inverse-free Berlekamp-Massey algorithm" Jyh-Horng Jeng and Trieu-Kien Troung, IEEE Trans. Commun., vol. 47, pp. 1488-1494, Oct. 1999.

* cited by examiner

*Primary Examiner*—Guy J. Lamarre
(74) *Attorney, Agent, or Firm*—Peter Zawilski

(57) ABSTRACT

A refinement of the Inverse-Free Berlekamp-Massey algorithm in which calculation of the discrepancy ($\delta$) is performed using coefficients having a common index (j), thereby reducing the number of multipliers required. The errata magnitudes can also be calculated using coefficients having a common index (j), also reducing the number of multipliers required. Common multipliers can be used for both calculations, thereby further reducing the number of multipliers required.

7 Claims, 5 Drawing Sheets

DECODING METHOD AND DECODER FOR REED SOLOMON CODE

Figure 1:
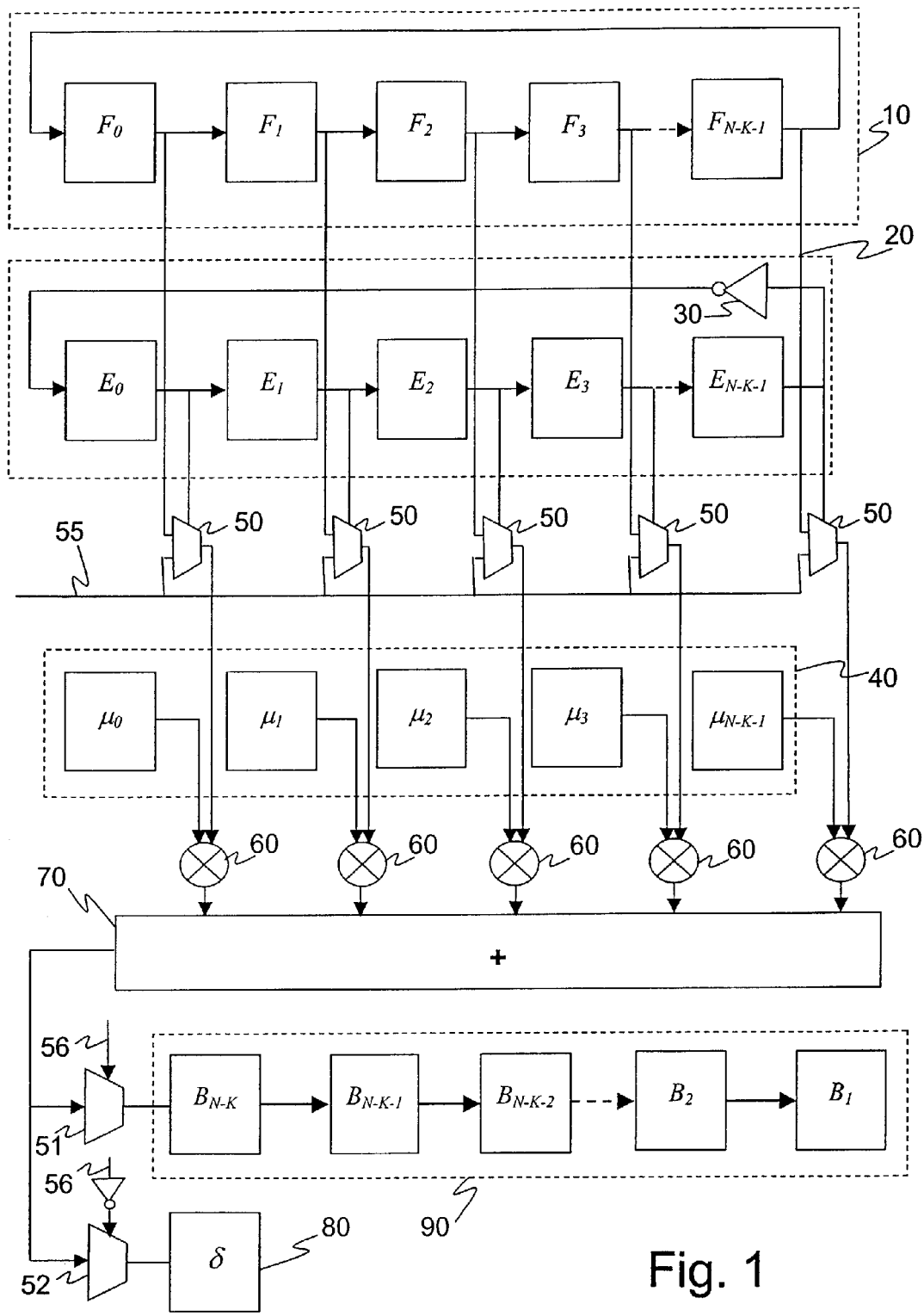

The present invention relates to a method of decoding Reed Solomon encoded data, a decoder therefor, and an electronic device comprising a decoder for decoding Reed Solomon encoded data.

Reed Solomon (RS) codes are used for correcting errors and erasures in a wide range of systems, including compact disc (CD), digital versatile disk (DVD), digital video broadcast (DVB) and hard disk drives (HDD). An (N,K) Reed-Solomon code having N symbols in a code word of which K symbols are information symbols can be used to correct s symbol erasures and v symbol errors in a code word, where $s+2v \leq N-K$. A Reed-Solomon code word containing errors and erasures, the erasures locations being known, can be decoded by first calculating the syndromes of the code word, second calculating from the syndromes and erasure locations an errata (errors and erasures) locator polynomial, third calculating the roots of the errata polynomial to obtain the locations of the errors and erasures, fourth calculating an errata evaluator polynomial, and fifth calculating the roots of the errata evaluator polynomial to obtain the magnitudes of the errors and erasures. It is well known in the art that the Berlekamp-Massey (BM) algorithm or the Euclidean algorithm can be used to determine the errata locator polynomial and the errata evaluator polynomial, and the Chien search can be used to determine the roots of the polynomials. It was suggested by Blahut in "Theory and practice of error control codes", R. E. Blahut, Addison-Wesley, 1984, that the errata locator polynomial can be computed directly by initialising the BM algorithm with the erasure locator polynomial and the syndrome polynomial, circumventing the need to calculate the Forney syndromes as defined in "On decoding BCH codes" Forney, Jr., IEEE Trans. Inform. Theory, vol. IT-11, pp 549–557, October 1965.

Based on this idea, Jyh-Horng Jeng and Trieu-Kien Troung in "On decoding of both errors and erasures of a Reed-Solomon code using an inverse-free Berlekamp-Massey algorithm" IEEE Trans. Commun., vol. 47, pp. 1488–1494, October 1999, presented an Inverse-Free BM Algorithm to find the errata locator polynomial directly in a RS decoder for correcting errors and erasures, as follows.

Let g(x) be the code generator polynomial of an (N,K) RS code over $GF(2^m)$ where g(x) is defined in its most generic form as:

$$g(x) = \prod_{j=0}^{N-K-1} (x - \alpha^{m(j+q)}) \quad (1)$$

where $\alpha$ is the root of the primitive polynomial p(x) that builds $GF(2^m)$ and q and m are parameters that define the code. If we represent a received RS code word vector as $\underline{r}=[r_0, r_1, \ldots, r_{N-1}]$ it is well known that the coefficients of the syndrome polynomial S(x) defined as:

$$S(x) = \sum_{n=1}^{N-K} S_n x^n \quad (2)$$

are calculated as follows:

$$S_n = \sum_{i=0}^{N-1} r_i . \alpha^{m(n+q)i} \quad (3)$$

If $Z_i$ is the $i^{th}$ known erasure location and $X_i$ the $i^{th}$ error location within $\underline{r}$, the erasure locator polynomial is defined as:

$$\Lambda(x) = \prod_{j=1}^{s}(1 - Z_j x) = \sum_{j=0}^{s} \Lambda_j x^j \quad (4)$$

where $\Lambda_0 = 1$. $\Lambda(x)$ is the polynomial with zeros at the inverse erasure locations. The errata locator polynomial with zeros at the inverse error and erasure locations is defined as:

$$\tau(x) = \left[\prod_{i=1}^{v}(1+X_i x)\right]\left[\prod_{n=1}^{s}(1+Z_n x)\right] = \sum_{j=0}^{v+s} \tau_j x^j \quad (5)$$

The Inverse-Free BM algorithm, which is used to determine the errata locator polynomial $\tau(x)$ from the syndrome polynomial S(x) and the erasure locator polynomial $\Lambda(x)$ is defined in the following way:

Step 1. Initially, define:

$$k=0 \; l^{(0)}=0 \; \gamma^{(0)}=1 \quad (6)$$

$$\lambda^{(0)}(x)=\Lambda(x) \; \mu^{(0)}(x)=\Lambda(x) \quad (7)$$

where k is an iteration counter.

Step 2. Set k=k+1. Stop if k exceeds the maximum number of errors correctable by the code i.e. if $k \geq N-K-s$. Otherwise, define $$\delta^{(k)} = \sum_{j=0}^{N-K} \mu_j^{(k-1)} S_{k+s-j} \quad (8)$$

$\delta^{(k)}$ is termed the discrepancy.

Step 3. Compute the following:

$$\begin{aligned}
\mu^{(k)}(x) &= \gamma^{(k-1)} \mu^{(k-1)}(x) - \delta^{(k)} x \lambda^{(k-1)}(x) \\
\lambda^{(k)}(x) &= \begin{cases} x\lambda^{(k-1)}(x) & \text{if } (2l^{(k-1)}) - k + 1 > 0 \text{ or if } \delta^{(k)} = 0 \\ \mu^{(k-1)}(x) & \text{otherwise} \end{cases} \\
l^{(k)} &= \begin{cases} l^{(k-1)} & \text{if } (2l^{(k-1)}) - k + 1 > 0 \text{ or if } \delta^{(k)} = 0 \\ k - l^{(k-1)} & \text{otherwise} \end{cases} \\
\gamma^{(k)} &= \begin{cases} \gamma^{(k-1)} & \text{if } (2l^{(k-1)}) - k + 1 > 0 \text{ or if } \delta^{(k)} = 0 \\ \delta^{(k)} & \text{otherwise} \end{cases}
\end{aligned} \quad (9)$$

Step 4. Return to step 2.

The errata locator polynomial $\tau(x)$ can be obtained by normalising $\mu(x)$ as follows:

$$\tau(x)=\mu(x)/\mu_0$$

where $\mu_0$ is the coefficient of $x^0$ in $\mu(x)$ and the Chien search may be used thereafter to determine the errata locations. The errata evaluator polynomial $A(x)$ is defined as:

$$A(x) \equiv S(x)\,\tau(x) \bmod x^{N-K-1} \tag{10}$$

and is thereafter used to calculate the errata magnitudes.

As described by Jeng and Troung, the errata magnitudes are given by $$\tilde{W}_r = \frac{A(\tilde{Z}_r^{-1})}{\tilde{Z}_r^{-(1+q)m}\tau'(\tilde{Z}_r^{-1})},\ 1 \le r \le s+v,$$

where $\tilde{Z}_r$ is the rth errata location, $\tau'(\tilde{Z}_r^{-1})$ is the derivative of $\tau(x)$ with respect to x, evaluated at $x = \tilde{Z}_r^{-1}$.

The advantage of the Inverse-Free BM Algorithm is that the separate computation of the Forney syndromes and the errata locator polynomial can be avoided. The disadvantage is that the number of multipliers involved in the calculation of the discrepances is a function of the square of the number of parity symbols, thus implying a big cost in terms of area for a silicon implementation of a decoder.

An object of the invention is to provide an improved decoding method and decoder for Reed Solomon encoded data.

According to a first aspect of the invention there is provided a method of decoding Reed Solomon encoded data, wherein calculation of a discrepancy comprises summation of first product terms where each first product term comprises a first product of coefficients having a first common index.

By calculating the discrepancy $\delta$ in terms of coefficients of polynomials $\mu(x)$ $F(x)$ and $E(x)$, where only coefficients having a common index are multiplied together, the number of Galois Field (GF) multipliers involved in the calculation of the errata locator polynomial $\tau(x)$ is a linear function of the number of parity symbols. Therefore the implementation complexity of a decoder can be reduced and the number of clock cycles required for decoding reduced.

According to a second aspect of the invention there is provided a method of decoding Reed Solomon encoded data, wherein calculation of an errata magnitude comprises summation of second product terms where each second product term comprises a second product of coefficients having a second common index.

By calculating errata magnitudes in terms of coefficients of polynomials $\mu(x)$ $F(x)$ and $E(x)$, where only coefficients having a common index are multiplied together, the number of GF multipliers involved in the calculation of the errata magnitudes is a linear function of the number of parity symbols. Therefore the implementation complexity of a decoder can be reduced and the number of clock cycles required for decoding reduced.

Furthermore, the use of a circular structure in the calculation of the first and/or second product terms makes the calculation itself independent of the number of iterations involved in the algorithm.

According to a third aspect of the invention there is provided a decoder for Reed Solomon encoded data, comprising means for operating in accordance with the first or second aspect of the invention.

According to a fourth aspect of the invention there is provided a decoder for Reed Solomon encoded data, in accordance with claim 6.

According to a fifth aspect of the invention there is provided an electronic device comprising a decoder in accordance with the third or fourth aspect of the invention. The electronic device may be an integrated circuit comprising a decoder. The electronic device may be, for example, apparatus for reading data from a storage medium such as an optical storage disk or a magnetic storage disc. The electronic device may be, for example, apparatus for receiving transmitted signals, such as wireless signals.

By calculating the discrepancy and error magnitude in terms of products of coefficients where the coefficients have common indices, it is possible to use the multipliers which are used for the calculation of the discrepancy also for the calculation of error magnitudes, further reducing decoder complexity.

The new polynomial $F^{(k)}(x)$ is defined as:

$$F^{(k)}(x) = \sum_{j=0}^{N-K-1} F_j^{(k)} x^j \tag{11}$$

where the generic coefficient $F_j^{(k)}$ is:

$$F_j^{(0)} = S_{(s-j)\bmod(N-K)+1} \tag{12}$$

$$F^{(k)}(x) = xF^{(k-1)}(x)\bmod(x^{N-K}+1) \tag{13}$$

Equation (13) for $F^{(k)}(x)$ represents a cyclic shift of $F^{(k-1)}(x)$. The enable polynomial $E^{(k)}(x)$ is defined as:

$$E^{(k)}(x) = \sum_{j=0}^{N-K-1} E_j^{(k)} x^j \tag{14}$$

where the generic coefficient $E_j^{(k)}$ is:

$$E_j^{(0)} = \begin{cases} 1 & \text{if } j \le s \\ 0 & \text{otherwise} \end{cases} \tag{15}$$

$$E^{(k)}(x) = xE^{(k-1)}(x)\bmod(x^{N-K}+1) \tag{16}$$

Equation (16) for $E^{(k)}(x)$ represents a cyclic shift of $E^{(k-1)}(x)$. In a decoder, the two variables $F^{(k)}(x)$ and $E^{(k)}(x)$ may be implemented as two circular registers that, after being initialised as in equations (12) and (15), shift at every clock cycle according to equations (13) and (16). The discrepancy defined in equation (8) is calculated as a function of $F^{(k)}(x)$ and $E^{(k)}(x)$:

$$\delta^{(k)} = \sum_{j=0}^{N-K-1} \mu_j^{(k-1)} F_j^{(k-1)} E_j^{(k-1)} \tag{17}$$

In the calculation of $\delta^{(k)}$ the GF multiplications always involve the same index coefficients i.e the $j^{th}$ coefficients, therefore the number of GF multipliers is equal to N–K. In the prior art calculation of $\delta^{(k)}$ according to equation (8) the GF multiplications involve the different indices, i.e. $j^{th}$ and $(k+s-j)^{th}$, and the latter index is dependent on the iteration number; as a result the number of GF multipliers required according to the prior art is $(N-K)^2$.

In order to calculate the errata magnitude, instead of A(x) defined in equation (10), a new variable B(x) is defined by:

$$B(x) = \sum_{t=1}^{N-K} B_t x^t = S(x)\mu(x) \bmod x^{N-K+1} \quad (18)$$

where the generic coefficient $B_t$ of B(x) is:

$$B_t = \sum_{j=0}^{t-1} \mu_j^{(N-K-s)} S_{t-j} \quad (19)$$

By initialising $F^{(k)}(x)$ and $E^{(k)}(x)$ as follows:

$$F_j^{(0)} = S_{(-j) \bmod (N-K)+1} \quad (20)$$

$$E_j^{(0)} = \begin{cases} 1 & j \le 0 \\ 0 & \text{otherwise} \end{cases} \quad (21)$$

each coefficient $B_t$ of B(x) is calculated as follows:

$$B_t = \sum_{j=0}^{N-K-1} \mu_j^{(N-K-s)} F_j^{(t)} E_j^{(j)} \quad (22)$$

In the decoder a circular shift is applied to $F^{(k)}(x)$ and $E^{(k)}(x)$ as in equations (13) and (16) for each coefficient $B_t$ of B(x).

In the calculation of $B_t$ the GF multiplications always involve the same index coefficients i.e the $j^{th}$ coefficients, therefore the number of GF multipliers required in a hardware implementation is equal to N–K. In the prior art calculation of the errata evaluator polynomial A(x) according to equation (10) the GF multiplications involve the different indices, i.e. $j^{th}$ and $(k+s-j)^{th}$, and the latter index is dependent on the iteration number; as a result the number of GF multipliers according to the prior art is $(N-K)^2$. Furthermore, the same resource as is used for the calculation of the discrepancy $\delta^{(k)}$ can be used, at different times, in the calculation of B(x).

From B(x) the errata magnitudes are calculated as $$\tilde{W}_r = \frac{B(\tilde{Z}_r^{-1})}{\tilde{Z}_r^{-(1+q)m} \mu'(\tilde{Z}_r^{-1})}, \quad 1 \le r \le s+v \quad (23)$$

where $\tilde{Z}_r$ is the rth errata location, $\mu'(\tilde{Z}_r^{-1})$ is the derivative of $\mu(x)$ with respect to x, evaluated at $x = \tilde{Z}_r^{-1}$.

Figure 2:
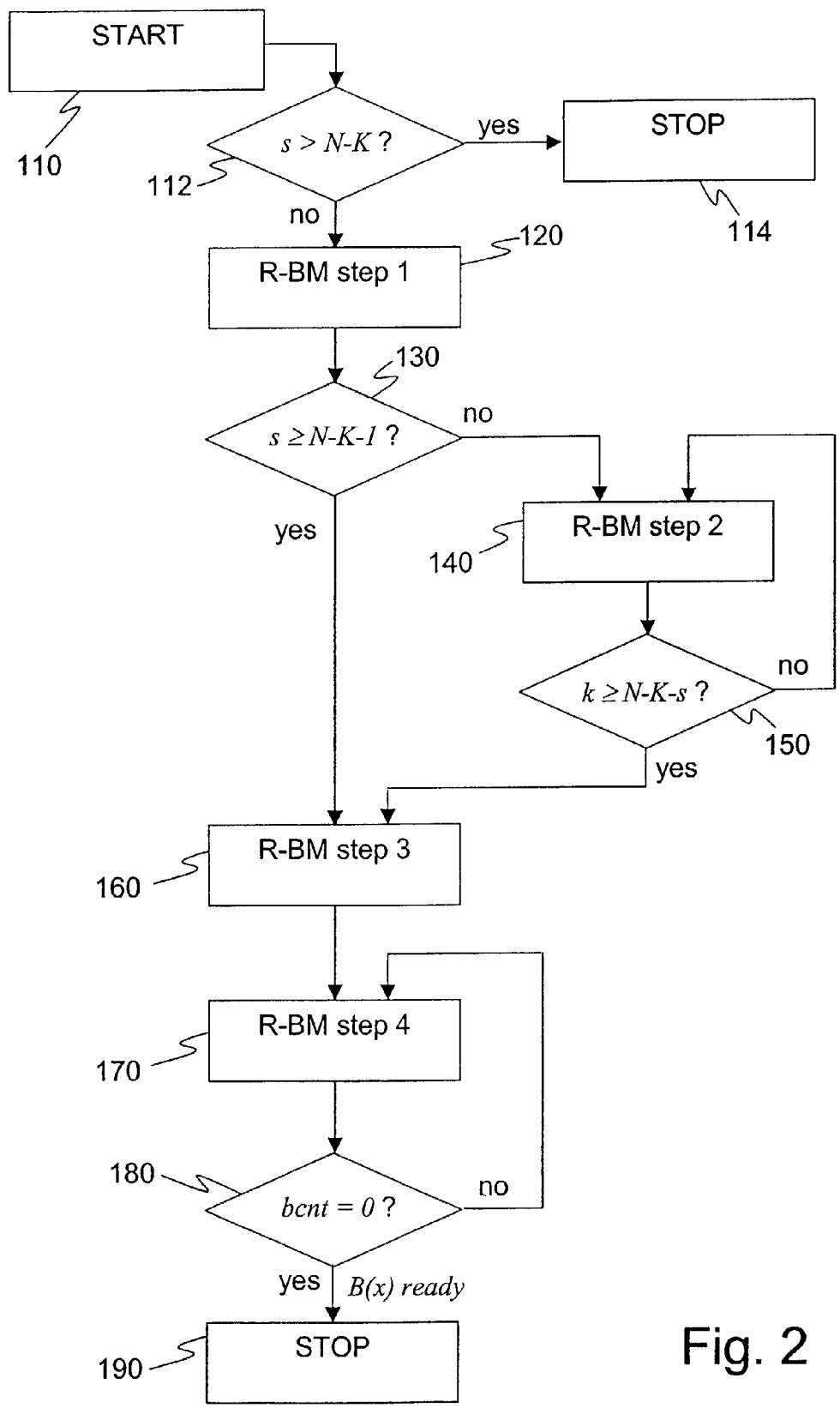
Figure 3:
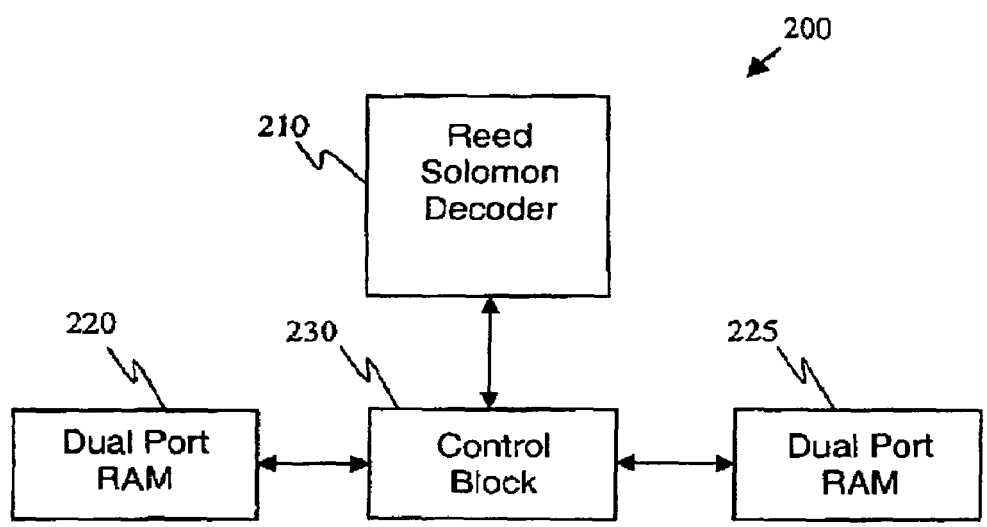
Figure 4:
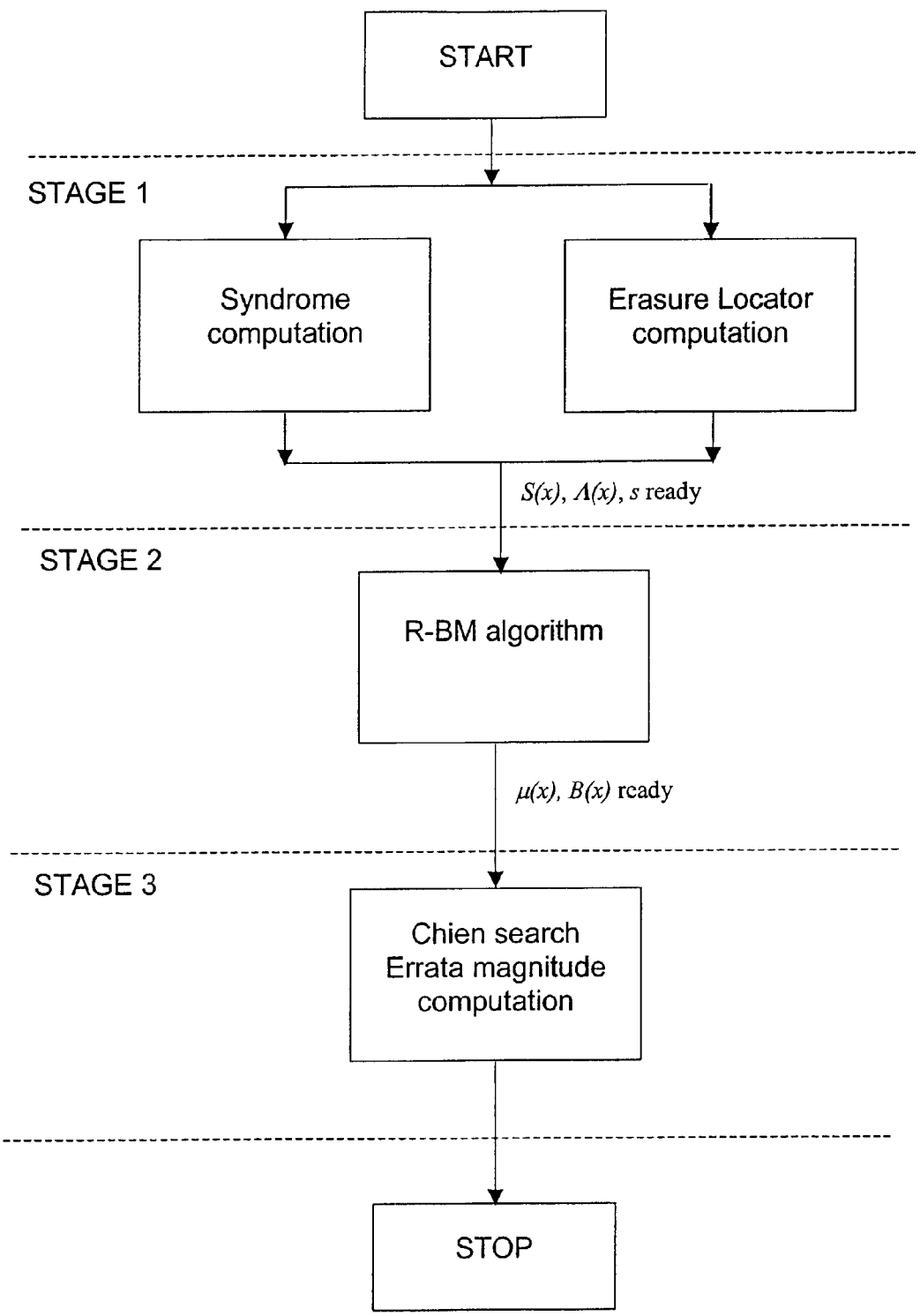
Figure 5:
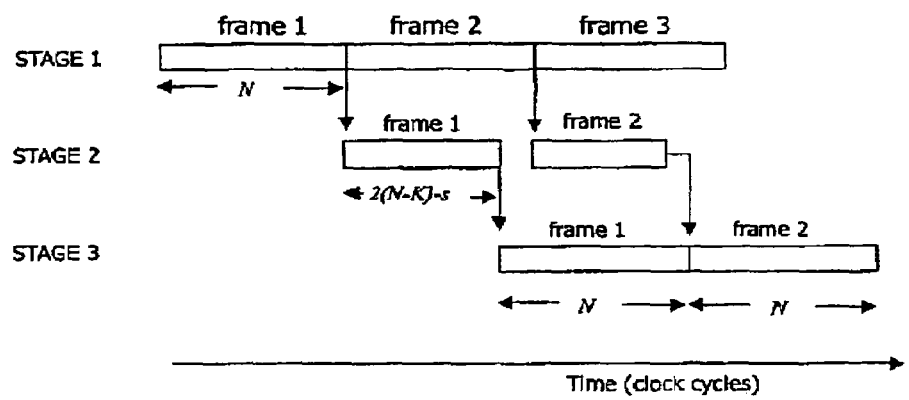

The invention will now be described, by way of example, with reference to the accompanying drawings wherein:

FIG. 1 is a block schematic diagram of a circuit for the calculation of $\delta^{(k)}$ and B(x), FIG. 2 is a flow chart for the improved BM decoding algorithm in accordance with the invention, FIG. 3 is a block schematic diagram of a codec device, FIG. 4 is a flow chart illustrating three main stages of Reed Solomon code decoding, and FIG. 5 illustrates pipelined operation of a Reed Solomon decoder comprising the improved BM decoding algorithm.

Figure 6:
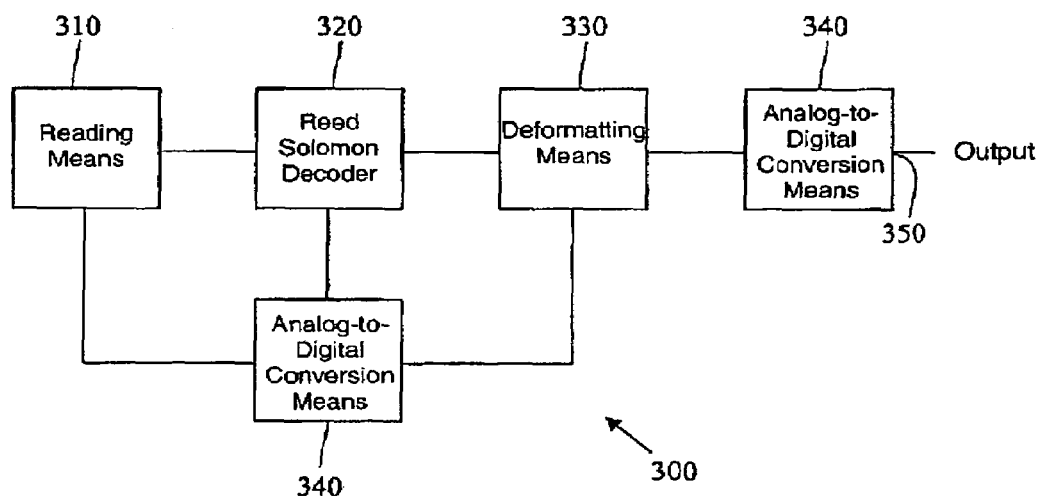

FIG. 6 is a block schematic diagram of an electronic device comprising a Reed Solomon decoder.

With reference to FIG. 1, the circuit comprises circular shift registers 10, 20 for storing respectively $F^{(k)}(x)$ and $E^{(k)}(x)$, the $E^{(k)}(x)$ register 20 comprising an inverter 30 in its feedback path. There is a register 40 for the storage of $\mu(x)$. Outputs from respective stages of the $F^{(k)}(x)$ register are multiplexed in respective multiplexers 50 with a control line 55 which is set to logical zero. Outputs from the respective stages of the $E^{(k)}(x)$ register 20 function as control lines for the respective multiplexers 50. Outputs from the respective multiplexers 50 are multiplied in respective multipliers 60 by outputs from the respective stages of the $\mu(x)$ register 40. The products of the respective multiplications are summed in a summer 70 and delivered via a multiplexer 51 to a register 90 that stores B(x) and via a multiplexer 52 to a register 80 that stores the discrepency δ. There is control means 56 for controlling the multiplexers 51 and 52 to determine whether the output of the summer 70 is delivered to the register 80 that stores the discrepency δ or to the register 90 that stores B(x).

With reference to the flow diagram of FIG. 2, the improved BM algorithm (R-BM) according to the invention is as follows, with each R-BM step being executed in a single clock cycle. Block 110 represents the start of the algorithm. At block 112 the value of s, the number of erasures, is tested. If s exceeds the correction capability of the code no errors or erasures can be corrected and the algorithm is terminated at block 114, otherwise flow proceeds to block 120.

At block 120 the R-BM step 1 is performed in which the variables k, l, γ and λ(x) to be utilised in step 2 are initialised according to equations (6) and (7). These variables are not illustrated in FIG. 1. μ(x) is initialised in register 40 according to equation (7). $F^{(k)}(x)$ and $E^{(k)}(x)$ are initialised in registers 10 and 20 respectively according to equations (12) and (15).

Then at block 130 the value of s, the number of erasures, is tested again. If the value of s is so large that no errors can be corrected, only erasures, the R-BM algorithm continues to R-BM step 3 described below, as the erasure locator polynomial Λ(x) is sufficient and the errata locator polynomial τ(x) need not be calculated. Otherwise, if s is sufficiently small that errors can be corrected, the R-BM step 2 is performed at block 140 to determine the errata (erasure and error) locator polynomial τ(x). In R-BM step 2, the iteration counter k is incremented. The discrepancy δ is calculated according to equation (17) and stored in register 80. The variables μ(x), λ(x), l and γ are updated according to equation (9). A right shift of the variables $F^{(k)}(x)$ and $E^{(k)}(x)$ in the registers 10 and 20 respectively is applied in accordance with equations (13) and (16).

R-BM step 2 is repeated iteratively for each value of k and after each iteration the value of k is tested at block 150. If k exceeds the error correcting capability of the code, taking into account the known number of erasures s, step 3 is performed at block 160, otherwise the next iteration of R-BM step 2 is performed. The result of the R-BM step 2 iterations is the polynomial μ(x) in register 40. In R-BM step 3 the down counter bcnt is initialised to N–K–1. $F^{(k)}(x)$ and $E^{(k)}(x)$ are initialised in registers 10 and 20 respectively according to equations (20) and (21). The algorithm then proceeds to R-BM step 4 at block 170.

At R-BM step 4 the coefficient $B_t$ of B(x) is calculated in register 90 according to equation (22), $F^{(k)}(x)$ and $E^{(k)}(x)$ are shifted in registers 10 and 20 respectively in accordance with equations (13) and (16), and the value of bcnt decremented. R-BM step 4 is repeated iteratively for each value of bcnt and after each iteration the value of bcnt is tested at block 180. If bcnt has reached zero, all the coefficients of B(x) have been calculated and the algorithm stops at block 190, otherwise the next iteration of R-BM step 4 is performed.

The circuit of FIG. 1 is implemented in a codec 200 as illustrated in FIG. 3 comprising a Reed Solomon decoder 210, two dual port RAMs 220, 225 and a control block 230 which interfaces between the decoder and the RAM's. The first RAM 220 has the capacity to hold 2 frames of data and the second RAM 225 holds one frame of data, one frame of data being equal to one Reed-Solomon code word. The second RAM 225 stores the data while the decoder 210 is running the syndrome and the R-BM algorithm calculation. The second RAM 225 serves two purposes. It allows a user to program (by means of a serial programming interface; not illustrated) in which order the decoded frame of data is output from the decoding 200, that is, byte 0 to N−1 or byte N−1 to 0. It also delays the frame of data before it is transmitted which allows a correct signal to be sent with the frame of data which indicates whether the received code word was successfully decoded or not.

The codec 200 is implemented in a pipeline structure with 3 main stages which are illustrated in FIG. 4. The number of erasures s present in a received code word is known at the commencement of the decoding process. In the first stage the syndrome polynomial S(x) and the erasure locator polynomial Λ(x) are computed using known methods. Stage 1 is run in N clock cycles. The second stage is the R-BM algorithm as described above with reference to FIG. 2. The processing time of the second stage varies with the number of erasures present in the received code word and has a max value of 2(N−K)+2 when there are no erasures and only errors are to be corrected, and a minimum value of (N−K)+2 when there are no errors and only erasure are to be corrected. The third stage is the well known Chien search in which the roots of μ(x) are calculated, which are the same as the roots of the errata locator polynomial τ(x), and errata magnitudes computed. The processing time of stage 3 is N clock cycles.

The 3-stage codec 200 is designed to have a pipeline structure such that three received code words can be processed by the codec 200 at any given time. The timing of the pipeline structure is illustrated in FIG. 5. While stage 1 is operating on the $n^{th}$ frame, stage 2 and 3 are operating on the $(n-1)^{th}$ and $(n-2)^{th}$ frames respectively.

The latency through the codec 200 depends on the size of a code word, the number of parity bits and the number of erasures and errors in a received code word. Its value in clock cycles is given by 2N+2(N−K)−s. As an example, for the DVB standard RS code (204, 188) the maximum latency is 440 clock cycles and the minimum latency is 424 clock cycles.

Referring to FIG. 6, there is illustrated an electronic device 300 for extracting Reed Solomon encoded audio and video data from an optical data storage disk and converting the extracted data to audio and video signals. The device 300 comprises a reading means 310 for reading Reed Solomon encoded data from an optical data storage disk. Coupled to an output of the reading means 310 is a Reed Solomon decoder 320 in accordance with the third aspect of the invention, for decoding the Reed Solomon encoded data read by the reading means 310. Coupled to an output of the Reed, Solomon decoder 320 is a deformating means 330 for extracting audio and video data from the decoded data. Coupled to an output of the deformating means 330 is an analogue-to-digital conversion means 340 for converting the audio and video data to analogue audio and video signals and providing the analogue audio and video signals on an output 350. The operation of the reading means 310, the Reed Solomon decoder 320, the deformating means 330 and the analogue-to-digital conversion means 340 is controlled by a processing means 360 which also controls a user interface (not illustrated).

The invention claimed is:

1. In a data processing circuit that decodes Reed Solomon encoded data, a data processing method wherein calculation of a discrepancy comprises using a parallel summation circuit to sum first product terms where each first product term comprises a first product of coefficients having a first common index.

2. A method of decoding Reed Solomon encoded data as claimed in claim 1, wherein the summation of first product terms is $$\sum_{j=0}^{N-K-1} \mu_j^{(k-1)} F_j^{(k-1)} E_j^{(k-1)},$$

the first product of coefficients having a first common index is $\mu_j^{(k-1)} F_j^{(k-1)} E_j^{(k-1)}$, and the first common index is j, where k is an iteration counter, N is the number of symbols in the encoded data, K is the number of information symbols in the encoded data, s is the number of erasures in the encoded data, $S_n$ for n=1 to N−K are syndromes of the encoded data, and where $$F^{(k)}(x) = \sum_{j=0}^{N-K-1} F_j^{(k)} x^j,$$

$F_j^{(0)} = S_{(s-j) \bmod (N-K)+1}$, $F^{(k)}(x) = xF^{(k-1)}(x) \bmod (x^{N-K}+1)$, $$E^{(k)}(x) = \sum_{j=0}^{N-K-1} F_j^{(k)} x^j,$$

$E_j^{(0)} = 1$ if $j \leq s$ and zero otherwise, and $E^{(k)}(x) = xE^{(k-1)}(x) \bmod (x^{N-K}+1)$.

3. In a data processing circuit that decodes Reed Solomon encoded data, a data processing method wherein calculation of an errata magnitude comprises parallel summation of second product terms in a summation circuit where each second product term comprises a second product of coefficients having a second common index.

4. A method of decoding Reed Solomon encoded data as claimed in claim 3, wherein the summation of second product terms is $$\sum_{j=0}^{N-K-1} \mu_j^{(N-K-s)} F_j^{(t)} E_j^{(t)},$$

the second product of coefficients having a common index is $\mu_j^{(N-K-s)} F_j^{(t)} E_j^{(j)}$, and the second common index is j, where t is an index of the errata magnitude, N is the number of symbols in the encoded data, K is the number of information symbols in the encoded data, s is the number of erasures in the encoded data, $S_n$ for n=1, N−K are syndromes of the encoded data, and where $$F^{(k)}(x) = \sum_{j=0}^{N-K-1} F_j^{(k)} x^j,$$

$F_j^{(0)} = S_{(-j) \mod (N-K)+1}$, $F^{(k)}(x) = xF^{(k-1)}(x) \mod(x^{N-K}+1)$, $$E^{(k)}(x) = \sum_{j=0}^{N-K-1} E_j^{(k)} x^j,$$

$E_j^{(0)} = 1$ if $j \leq s$ and zero otherwise, and $E^{(k)}(x) = xE^{(k-1)}(x) \mod(x^{N-K}+1)$.

5. A decoder for Reed Solomon encoded data, comprising means for performing the steps of claim 1.

6. A decoder for Reed Solomon encoded data, comprising:
means for performing the steps of claim 1 in combination with a method of decoding Reed Solomon encoded data,
wherein calculation of an errata magnitude comprises summation of second product terms where each second product term comprises a second product of coefficients having a second common index, and
multiplier means which generates the first product terms and which also generate the second product terms.

7. An electronic device comprising a decoder as claimed in claim 5.

* * * * *